(12) United States Patent
Betz et al.

(10) Patent No.: US 7,417,198 B2
(45) Date of Patent: Aug. 26, 2008

(54) RADIOFREQUENCY POWER SEMICONDUCTOR MODULE WITH CAVITY HOUSING, AND METHOD FOR PRODUCING IT

(75) Inventors: Bernd Betz, Neutraubling (DE); Jochen Dangelmaier, Beratzhausen (DE); Rudolf Lehner, Laaber (DE); Stefan Paulus, Zeitlarn (DE)

(73) Assignee: Infineon Technologies AG, Munich (DE)

( * ) Notice: Subject to any disclaimer, the term of this patent is extended or adjusted under 35 U.S.C. 154(b) by 379 days.

(21) Appl. No.: 10/515,236

(22) PCT Filed: May 22, 2003

(86) PCT No.: PCT/DE03/01656

§ 371 (c)(1),
(2), (4) Date: Jul. 18, 2005

(87) PCT Pub. No.: WO03/098666

PCT Pub. Date: Nov. 27, 2003

(65) Prior Publication Data

US 2006/0012016 A1    Jan. 19, 2006

(30) Foreign Application Priority Data

May 22, 2002    (DE) ................ 102 23 035

(51) Int. Cl.
*H01L 23/495* (2006.01)
*H05K 7/20* (2006.01)

(52) U.S. Cl. ............... 174/536; 174/548; 257/704; 257/676; 257/713; 257/723; 257/690; 257/698

(58) Field of Classification Search ............ 174/536, 174/548; 257/704, 676, 713, 723, 690, 698
See application file for complete search history.

(56) References Cited

U.S. PATENT DOCUMENTS

| 4,012,766 | A | 3/1977 | Phillips et al. |
| 4,246,697 | A | 1/1981 | Smith |
| 4,762,983 | A | 8/1988 | Oogita et al. |
| 5,070,390 | A | 12/1991 | Shimizu |
| 5,458,716 | A | 10/1995 | Alfaro et al. |
| 5,466,969 | A | 11/1995 | Tsunoda |
| 5,661,343 | A | 8/1997 | Takahashi et al. |
| 6,212,087 | B1 | 4/2001 | Grant et al. |
| 2003/0076659 | A1 * | 4/2003 | Ichitsubo et al. ............ 361/748 |

FOREIGN PATENT DOCUMENTS

| DE | 3616969 | 11/1987 |
| DE | 19530577 | 2/1997 |
| DE | 19509441 | 8/1997 |
| EP | 0563969 | 9/1997 |
| GB | 2174538 | 11/1986 |
| JP | 03093290 | 4/1991 |
| JP | 04284650 | 9/1992 |
| WO | 95/15007 | 6/1995 |
| WO | 97/07540 | 2/1997 |

* cited by examiner

*Primary Examiner*—Hung V Ngo
(74) *Attorney, Agent, or Firm*—Dicke, Billig, Czaja, PLLC

(57) ABSTRACT

The invention relates to a radiofrequency power semiconductor module having a cavity housing constructed from three modules, a 1st module, which has an upwardly and downwardly open housing frame with horizontally arranged flat conductors, a 2nd module, which has the chip island as a heat sink with at least one radiofrequency semiconductor component, the 2nd module forming the bottom of the cavity housing, and a 3rd module, which has the housing cover.

28 Claims, 4 Drawing Sheets

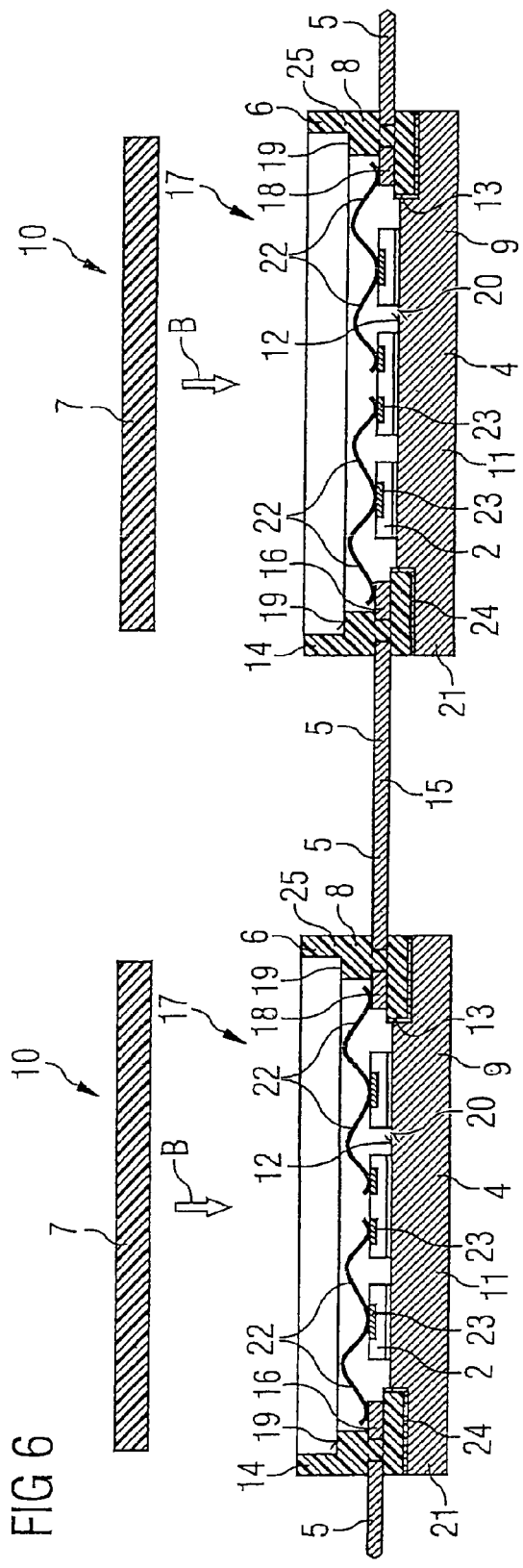
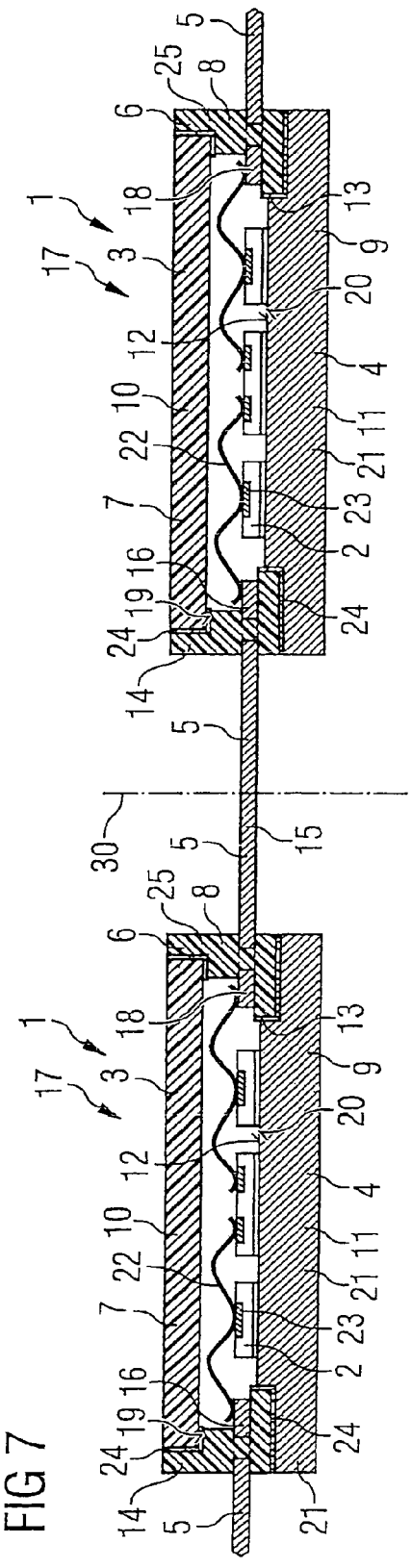
FIG 6
FIG 7

RADIOFREQUENCY POWER SEMICONDUCTOR MODULE WITH CAVITY HOUSING, AND METHOD FOR PRODUCING IT

CROSS REFERENCE TO RELATED APPLICATION

This Utility Patent Application claims the benefit of the filing date of Application Number DE 102 23 035.8, filed May 22, 2002 and International Application No. PCT/DE03/001656, filed May 22, 2003, all of which are herein incorporated by reference.

FIELD OF THE INVENTION

The invention relates to a radiofrequency power semiconductor module having a cavity housing and having at least one radiofrequency semiconductor component and having a chip island, on which the radiofrequency semiconductor component(s) is/are arranged, and to a method for producing it.

BACKGROUND

On account of the high evolution of heat and the radiofrequency properties, radiofrequency power semiconductor modules are accommodated in cavity housings made of ceramic. Moreover, it is possible to construct high-power modules which are packaged completely in plastics composition and whose radiofrequency semiconductor components are arranged on a chip island, at least one surface of which forms an outer wall of the housing that can be cooled by the surroundings. However, the use of such high-power modules for radiofrequency applications is limited on account of the dielectric properties of the plastic housing composition into which the radiofrequency semiconductor components are embedded.

The flat conductor frames required for devices of this type are constructed in extremely complex fashion since, on the one hand, they have to afford a first plane for free-standing flat conductors and, on the other hand, they have to afford a second plane with a solid metallic chip island for dissipating the heat. The technical outlay and outlay on costs for flat conductor frames of this type is of a similar magnitude to that for ceramic cavity housings. However, the heat dissipation of ceramic cavity housings is not particularly effective. Moreover, both housing forms have the disadvantage that the seating or the fixing of the radiofrequency semiconductor component can only be successfully tested when the radiofrequency semiconductor components are accommodated and wired in the relatively expensive housing forms, so that functional and quality tests can only be used relatively late for the known housing forms.

Therefore, it is an object of the present invention to specify a radiofrequency power semiconductor module which overcomes the disadvantages in the prior art and can be produced inexpensively with a reduced failure rate.

This object is achieved by means of the subject matter of the independent claims. Advantageous developments of the invention emerge from the subclaims.

The invention specifies a radiofrequency power semiconductor module having a cavity housing and at least one radiofrequency semiconductor component arranged in the cavity housing. Moreover, the cavity housing has a chip island, on which the radiofrequency semiconductor components are arranged. Furthermore flat conductors are anchored in a housing frame closed off by a housing cover. This radiofrequency power semiconductor module has three prefabricated modules, a 1st module having flat conductors arranged horizontally in the upwardly and downwardly open housing frame. A 2nd module has the chip island as a heat sink with at least one radiofrequency semiconductor component and forms the bottom of the cavity housing. The 3rd module closes up the cavity housing toward the top and has the housing cover.

A radiofrequency power semiconductor module of this type which is composed of three modules has the advantage that each module can inherently be tested in respect of its quality and functionality before the three modules are assembled to form an electronic device. What is particularly advantageous in this case is that the radiofrequency semiconductor component can already be positioned on a heat sink that replaces the previous chip island of a flat conductor frame. Consequently, the chip island can be produced completely independently of a flat conductor frame with simple means and forms the bottom of the cavity housing, which constitutes a lowering of the production costs since there is no need to provide complex flat conductor frames having, in two separate planes, on the one hand flat conductors and on the other hand a chip island that can be cooled externally. Such a complex construction of a three-dimensional flat conductor frame for realizing a radiofrequency power semiconductor module with a cooled chip island can consequently be avoided.

Moreover, it is possible to qualitatively and functionally check the secure anchoring of the radiofrequency semiconductor components on the chip island, furthermore the electrical contact between the radiofrequency semiconductor components and the chip island and the positioning of the radiofrequency semiconductor components on the chip island before the 2nd module is assembled with the 1st module. This advantage becomes particularly apparent when a plurality of radiofrequency semiconductor components are to be accommodated on the heat-dissipating chip island.

A further advantage of the radiofrequency power semiconductor module according to the invention is that the housing frame with flat conductors anchored therein can be produced as an independent module in mass production and it is possible to check the dimensional accuracy and precision of the housing frame in conjunction with the flat conductors anchored therein prior to assembly with the 2nd module. Consequently, the probability of only functional 1st modules being mechanically connected to functional 2nd modules to form an upwardly open cavity housing is improved and the failure rate after the connection of the flat conductors in the interior of the cavity housing to the electrodes of the radiofrequency semiconductor components is reduced.

In this respect, it should be noted that radiofrequency power semiconductor modules are to be realized by connecting hundreds of bonding wires in parallel on a flat conductor end to a corresponding electrode of a radiofrequency power semiconductor, so that it is advantageous if it is possible to carry out such cost-intensive production steps such as bonding with pretested 1st and 2nd modules of a radiofrequency power semiconductor module, whereby costs and reject rate can be considerably reduced.

In one embodiment of the invention, the housing frame may be produced from a plastic housing composition. The plastic material of this plastic housing composition may correspond to the plastic housing composition that is used for complete packaging of radiofrequency semiconductor components on a flat conductor frame. In the case of the present invention, it is possible to produce the housing frame on the flat conductor frame independently of the production of the 2nd module and thus independently of the fixing of the radiofrequency semiconductor components on a chip island. The same applies to the production of a housing frame made of a ceramic composition. The use of ceramic as housing frame has the advantage of improved dielectric properties compared with the plastic housing frame. However, the production of a ceramic housing frame is associated with higher costs compared with the production of a plastic housing frame.

The housing frame may be one of a plurality of housing frames arranged on a flat conductor frame. In this case, exclusively inner flat conductor ends—arranged in one plane—of each device position of the flat conductor frame are embedded in the housing frame. The flat conductor frame is of uncomplicated construction in this respect since the provision of a chip island is completely obviated for the realization of the 1st module. The housing frame merely anchors the inner flat conductor ends in a plastic housing composition or in a ceramic composition. In this case, the inner flat conductor ends may partly be kept free of housing frame material and have refined surfaces as bonding fingers. Such refined surfaces may have nickel, gold, silver or alloys thereof in order to facilitate a reliable bonding of gold bonding wires on these uncovered flat conductor ends in the housing frame.

The downwardly and upwardly open housing frame may widen in stepped fashion from bottom to top. This stepped extension makes it possible to provide a relatively large opening for the housing cover and to provide a correspondingly reduced opening for the housing bottom in the form of the chip island as heat sink. The enlarged opening for the housing cover has the advantage that a larger access opening is available for wiring the radiofrequency semiconductor components of the 2nd module with the bonding fingers of the 1st module, said access opening facilitating bonding from above.

The stepped formation of the housing frame from bottom to top may be configured in such a way that the housing frame has a lower attachment, with which the 2nd component can be brought into engagement or is in engagement. At the same time, the inner flat conductor ends can also be arranged on this lower attachment of the housing frame, the inner housing wall being set back relative to the opening for the 2nd component, so that a portion of the inner flat conductor ends remains free of housing frame material, so that these inner flat conductor ends that remain free can be accessed during bonding.

An upper attachment of the upwardly open housing frame formed in stepped fashion is suitable for receiving the 3rd component as housing cover. The 3rd component can thus be brought into engagement with said upper attachment. With this 3rd component, the radiofrequency power semiconductor module is completed and, in particular, the cavity housing is perfect. In an inexpensive version, the housing cover may comprise a plastic plate, but housing covers also based on ceramic and/or based on metal are preferred since they permit greater power losses for the radiofrequency semiconductor components that are to be arranged in the cavity housing. Moreover, the dielectric properties of a ceramic cover are more favorable than those of a plastic cover as housing covering. A metallic cover in turn shields the radiofrequency power semiconductor module from electromagnetic interference sources.

In a further embodiment of the invention, the 2nd component has a metal base, which projects from a metallic baseplate and can be brought into engagement with the lower attachment of the housing frame. Such a metal base may be formed in one piece with the metallic baseplate by electrodepositing the metal base on the baseplate or machining the baseplate on its top side in such a way that a metal base projects. Such a metal base has the advantage that the respective radiofrequency semiconductor component arranged on the metal base can be positioned exactly in relation to the housing frame. For this purpose, the base may have a height which, together with the thickness of the radiofrequency semiconductor components, approximately has the height level like the surfaces of the inner flat conductor ends on the lower attachment of the housing frame, which may have a bondable coating. Such dimensioning of the metal base has the advantage that the bonding connections can be arranged in a single plane, which facilitates the bonding operation per se and precludes fault sources.

In a preferred refinement, the radiofrequency power semiconductor module according to the invention is a radiofrequency power amplifier (RF power amplifier), in particular for mobile radio base stations.

The radiofrequency semiconductor components arranged on the metal base then typically have a plurality of radiofrequency power semiconductor components, in particular so-called RF-LDMOS transistors. Furthermore, an input diode and an output diode may be provided in order to protect the radiofrequency power amplifier against overvoltage.

Moreover, a plurality of the radiofrequency semiconductor components may be integrated circuits (ICs) in order to pass the high currents of the radiofrequency power semiconductor components to the flat conductors and conversely to take them up from the flat conductors, the radiofrequency power semiconductor module has hundreds of bonding wires in parallel from the inner flat conductor ends to the electrodes of the radiofrequency semiconductor components. These hundreds of bonding wires in practice form a flat cable with which the inner flat conductor ends are connected to the respective electrodes of the radiofrequency semiconductor components.

The three modules of the radiofrequency power semiconductor module may be connected to one another by means of adhesive layers or adhesive films. For this purpose, the adhesive may be applied to the respective boundary areas or joining areas of the individual modules before and after the latter are joined together to form an electronic device.

A method for producing a radiofrequency power semiconductor module has the following method steps:

Firstly, a 1st module is produced. This 1st module comprises an upwardly and downwardly open housing frame with embedded inner flat conductor ends. Flat, conductors project outward from the housing frame.

A 2nd module may be produced in parallel, said 2nd module having a metal base on a metal plate. At least one radiofrequency semiconductor component is arranged on the metal base, it being possible to fit the metal base into the downwardly open housing frame.

In parallel with the production of the 1st and 2nd modules, the 3rd modules may already be produced in the form of housing covers which can be fitted into the upwardly open housing frame. After the production of the three modules, functional and quality tests of these three individual modules are carried out. Afterward, firstly the 1st and 2nd modules are assembled by adhesively bonding the metal base of the 2nd module into the upwardly open housing frame of the 1st module. After assembly, the inner flat conductors of the 1st module can be connected to electrodes of the radiofrequency semiconductor components of the 2nd module via the upper opening of the housing frame.

Finally, the upwardly open housing frame can be completed with the 3rd module to form a cavity housing. This method of modular design has the advantage that each module can inherently be tested in respect of its function and its quality before the cost-intensive step of connecting the inner flat conductor ends to the electrodes of radiofrequency semiconductor components is carried out. On account of the power consumption of the radiofrequency semiconductor components, in the case of this connection hundreds of bonding wires are fitted in parallel on one of the inner flat conductors and placed onto one of the common electrodes of the radiofrequency semiconductor components.

In the case of radiofrequency power semiconductor modules, in particular, this method has the particular advantage that only such modules which have no functional and quality deficiencies whatsoever are assembled to form an electronic device. This drastically reduces the rejects in the production of radiofrequency power semiconductor modules.

In addition, it is possible to use a simplified flat conductor frame since this flat conductor frame only has to comprise free-standing flat conductors and does not have to have an integrally arranged chip island.

In detail, in order to produce a 1st module, a flat conductor frame with a multiplicity of device positions may be produced, flat conductors with free-standing flat conductor ends being arranged in one plane in each of the device positions and a downwardly and upwardly open housing frame being fitted in each of the device positions, the inner flat conductor ends being embedded in the housing frames, while the flat conductors project from the housing frame. Such a continuous strip comprising a flat conductor frame with a multiplicity of device positions and housing frames arranged thereon can easily be tested with regard to its quality and functionality, housing frames whose dimensions do not correspond to the requirements for frictionless assembly with the other modules being able to be marked and separated by sorting before cost-intensive method steps for producing the radiofrequency power semiconductor module are to be carried out.

The free-standing flat conductor ends to be incorporated into the housing frame may also be refined with a bondable coating on the flat conductor frame. Such bondable coatings may have nickel, gold, silver or alloys thereof. An essential feature of the quality control is, after the application of the housing frame, whether the bondable coating of the inner flat conductor ends is freely accessible or whether material of the housing frame covers parts of said bondable coating, so that the reliable bonding is not assured. Housings with faults of this type can be separated by sorting prior to the assembly of the 1st and 2nd modules.

The molding of the housing frame may be effected by means of injection-molding of a plastic housing composition. For this purpose, the flat conductor frame is inserted into an adapted injection mold and the free-standing inner flat conductor ends are embedded into the plastic housing composition in each of the device positions. Since the injection-molding of plastic housing compositions can be carried out relatively cost-effectively, it is possible to provide a flat conductor frame which has a housing frame made of plastic in each device position after the injection-molding.

If the housing frame is intended to comprise a ceramic material, then firstly a green body is molded by compression molding in each device position, the free-standing inner flat conductor ends being embedded into the green body, formed as a housing frame. The flat conductor frame with the molded-in green body as housing frame then passes through a sintering furnace, in which this green body material is sintered to form a ceramic housing frame. Although this process is more complicated than the injection-molding of plastic housing compositions, a ceramic housing frame affords dielectric advantages over a plastic housing frame. In this case of the ceramic housing frame, too, it is subsequently possible after sintering to carry out a quality and functional testing in the course of which unsuitable housing frames are marked on the flat conductor frame, so that no further modules of the cavity housing are connected to these marked flat conductor frames.

In order to produce the 2nd module, firstly metal plates with a base adapted to the downwardly open housing frame are produced. Afterward, at least one radiofrequency semiconductor component is arranged on each of the bases and its function and connection to the base are tested. In this case, unsuitable 2nd modules can be separated by sorting. This production method and test method ensure that only qualitatively and functionally high-quality 2nd modules are connected to 1st modules of the cavity housing.

Before the 1st and 2nd modules are joined together, the 1st module may be provided with an adapted adhesive film on the underside of the housing frame. An adhesive film may also be provided for joining together the 1st and 3rd modules. The use of adhesive films has the advantage that a correspondingly structured strip of adhesive film can be used for a plurality of housing frames on a strip-type flat conductor frame, which reduces the production costs.

After the 1st and 2nd modules are joined together, the inner flat conductor ends of the 1st module are connected to electrodes of the radiofrequency semiconductor components of the 2nd module by multiple parallel bonding of hundreds of bonding wires. In this case, the cavity housing remains upwardly open and it is only in the last method step that then, given successful bonding, the 3rd module in the form of a housing cover as termination is adhesively bonded onto the cavity housing by means of an adhesive layer or an adhesive film. In this case, said housing cover may be produced from plastic or from metal or else ceramic. The choice of material of the housing cover essentially depends on the radiofrequency use and the power range of the radiofrequency semiconductor components arranged on the chip island with a heat sink. While the cavity housing can advantageously be shielded against electromagnetic waves and interference sources with a metal cover, a ceramic cover is distinguished by its better dielectric properties compared with a plastic cover.

To summarize, it should be emphasized that a distinction can be made between the following radiofrequency power housings:

1. Cavity ceramic housings, permitting a high frequency range. These housings have a stable heat sink made of copper-tungsten (CuW) or similar alloys onto which the radiofrequency semiconductor components are soldered or alloyed. This alloying-on process is carried out at temperatures of between 300 and 450° C. A ceramic lamina is mounted peripherally around the soldered-on radiofrequency semiconductor components, flat conductor connections made of metal being mounted on said lamina in a manner insulated from the heat sink. Such a circuit carrier for radiofrequency power semiconductor components is supplied in preassembled form by a supplier. A housing concept of this type has the disadvantage of high costs and a high outlay since individual device handling and fabrication are required. However, the ceramic results in high thermal stability of the cavity housing and enables the devices to be operated in a frequency range greater than 3 GHz.

2. Another variant of a radiofrequency power module housing comprises a plastic housing injection-molded all around with an exposed heat sink. However, such a housing with a plastic housing injection-molded around can be used only up to frequencies of approximately 1 GHz. Consequently, such plastic housings injection-molded all around cannot be used for GSM and UMTS applications. The low limiting frequency is attributable to the capsulation of the bonding wires with plastic housing composition and to the large dimensions between the radiofrequency semiconductor components and the external connections, which is realized by bonding wires of corresponding length. Consequently, although this type of housing has favorable production costs since composite fabrication is possible, the limiting frequency for the radiofrequency power devices at 1 GHz is extremely low.

3. It is also possible to use plastic cavity housings with an integrated heat sink. The frequency ranges are thereby slightly increased, but the limiting frequency range can only be increased by a factor of 2.5 to 2.5 GHz. The pre-injection-molded plastic cavity housings with an integrated heat sink have the advantage of favorable production costs, but sealing webs become necessary during the injection-molding of the housing, so that it is not possible to optimize the dimensions between the chip position and the inner flat conductors. By contrast, the invention has the following advantages:
   1. favorable material and production costs
   2. composite fabrication is possible
   3. a frequency range greater than 2.5 GHz can be realized and
   4. the use of soldering and alloying processes, in particular when applying the chip to the 2nd module, ensures lower thermal resistances for high-power applications. By way of example, a power loss during continuous operation of 240 W can thereby be realized.

The separate supply of the heat sink which, unlike hitherto, is not connected to the flat conductor frame enables the radiofrequency semiconductor components to be soldered or alloyed on the chip island at extremely high temperatures since the 2nd module can be produced completely separately from the housing frame with the flat conductor frame. Only afterward is the thermal conduction block including the radiofrequency semiconductor components inserted into the cavity housing whilst complying with narrow tolerances of the chips with respect to the inner flat conductor ends. Consequently, the advantages of different technologies can be brought together by means of the present invention to yield a housing product that can be produced cost-effectively and significantly more reliably.

SUMMARY

The invention provides a power semiconductor module. In one embodiment, the invention provides a power semiconductor module with cavity housing, and method of producing the power semiconductor module.

BRIEF DESCRIPTION OF THE DRAWINGS

The invention will now be explained in more detail on the basis of embodiments with reference to the accompanying figures.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2 to 7 illustrates a production method for producing a radiofrequency power semiconductor module on the basis of diagrammatic cross sections through components after individual method steps.

FIG. 2 illustrates a diagrammatic cross section through a flatconductor frame with a plurality of device positions.

FIG. 3 illustrates a diagrammatic cross section through a flatconductor frame with a fitted housing frame in a plurality of device positions.

FIG. 4 illustrates a diagrammatic cross section through a 2nd module with radiofrequency semiconductor components on a chip island.

FIG. 5 illustrates a diagrammatic cross section through a radiofrequency power semiconductor module after bonding and prior to covering the cavity housing with a housing cover.

FIG. 6 illustrates a diagrammatic cross section through the 3rd module of the radiofrequency power semiconductor module.

FIG. 7 illustrates a diagrammatic cross section through a plurality of radiofrequency power semiconductor modules on a flat conductor frame prior to separation of the flat conductor frame for the production of individual electronic devices.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
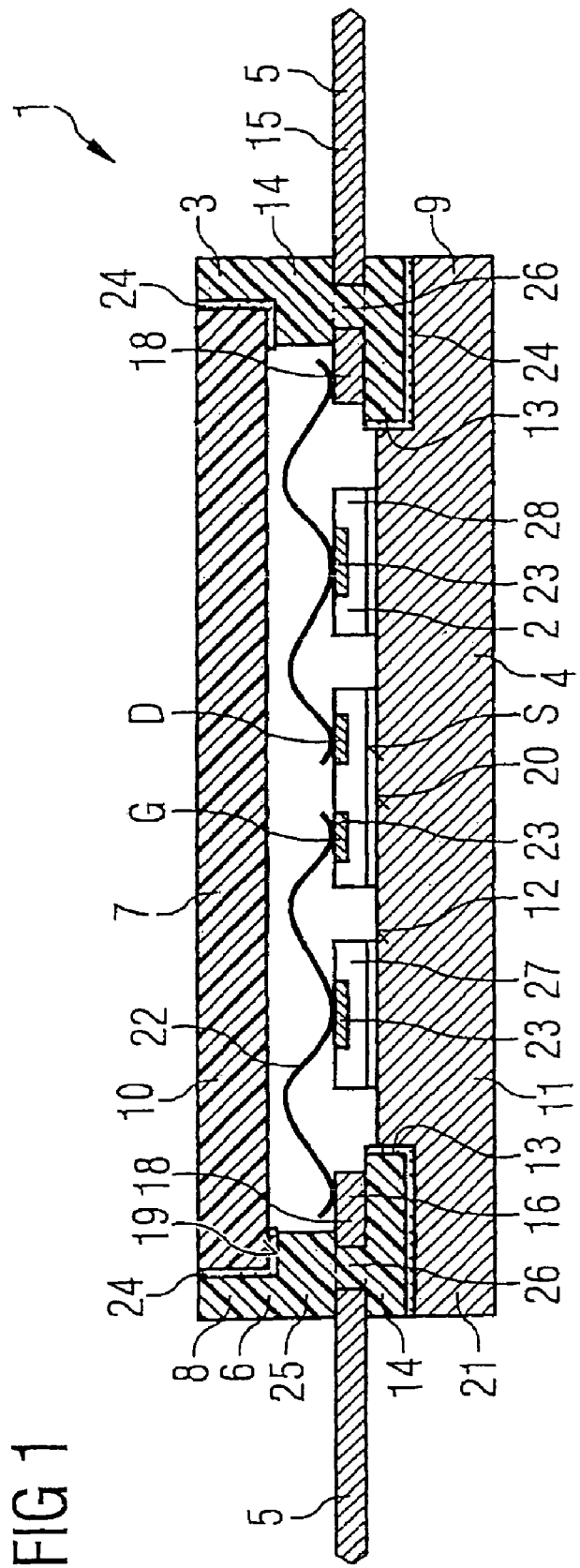
FIG. 1 illustrates a diagrammatic cross section through a radiofrequency power semiconductor module with a cavity housing.

FIG. 1 illustrates a diagrammatic cross section through a radiofrequency power semiconductor module 1 with a cavity housing 3 in one embodiment of the invention. The reference symbol 2 denotes radiofrequency semiconductor components, of which three radiofrequency semiconductor components are arranged on a chip island 4. The reference symbol 5 denotes flat conductors that are anchored by their inner flat conductor ends 16 in a housing frame 6 of the radiofrequency power semiconductor module 1. The reference symbol 7 denotes a housing cover, which hermetically seals the cavity housing 3 toward the top. The reference symbols 8, 9 and 10 denote three modules of which the radiofrequency power semiconductor module 1 is composed. The reference symbol 11 denotes a heat sink, which essentially composes the chip island 4.

The reference 12 denotes the bottom of the cavity housing 3, which is formed by a metal base 20 of the chip island 4. The reference symbol 14 denotes a housing frame, which is constructed from a plastic molding composition in this embodiment of the invention. The reference symbol 15 denotes a flat conductor frame, of which the flat conductors 5 projecting from the housing frame 14 can be seen in this embodiment of the invention. The reference symbol 18 denotes bonding fingers, which are formed by a portion of the inner flat conductor ends 16 and which have a refined surface in order to enable reliable bonding for the fitting of bonding wires 22.

The reference symbol 13 denotes a lower attachment of the housing frame, which is extended in a stepped fashion from bottom to top in this embodiment of the invention, and the reference symbol 19 denotes an upper attachment, in which the 3rd component of the radiofrequency power semiconductor module, namely the housing cover 7, can be fitted. The reference symbol 23 denotes electrodes on the radiofrequency semiconductor component 2. The reference symbol 24 denotes adhesive layers and the reference symbol 25 denotes a plastic housing composition. The radiofrequency power semiconductor module 1 is essentially constructed from three modules 8, 9, and 10 that can be produced separately. These three modules are configured such that they can be adapted with respect to one another and can be inserted into one another.

The 1st module 8 essentially has a housing frame 6, which, in this embodiment of the invention, is constructed from a plastic housing composition 25 and has been applied to a flat conductor frame 15 by an injection-molding method. In this case, the flat conductors 5 have been anchored in the injection-molding composition 25. In order to support the anchoring of the inner flat conductor ends 16 in the plastic housing frame 14, the flat conductor ends have passage openings 26. The injection-molding composition 25 of the housing frame 6 is provided both above and below the inner flat conductor ends 16, so that the inner flat conductor ends are practically embedded in the plastic housing composition 25 apart from a region that forms bonding fingers 18.

The housing frame 7 is open from bottom to top, the opening in the housing frame 7 widening in stepwise fashion from bottom to top. The inner flat conductor ends 16 are arranged on the bottommost step or the bottommost attachment 13 of the housing frame. The inner wall of the housing frame is set back above the inner flat conductor ends 16, thereby enabling an access to the bonding fingers. An upper attachment 19 is configured in such a way that it enables an opening for fitting in a housing cover.

In this embodiment, the 2nd module 9 comprises a metallic baseplate 21 from which a metal base 20 can project. Baseplate 21 and metal base 20 are dimensioned in such a way that they can be adapted to the lower attachment 13.

In this embodiment of the invention, the radiofrequency semiconductor components are three radiofrequency power semiconductor components which together form a radiofrequency power semiconductor module. The central radiofrequency semiconductor component is a radiofrequency power transistor, having a source electrode S and a drain electrode D. The gate electrode G is protected from overvoltage by an input power diode 27. At the same time, a third radiofrequency semiconductor component 2 in the form of a power diode 28, which forms the output diode, is accommodated on the chip island 4. The three radiofrequency semiconductor components or electrodes are connected to the bonding fingers 18 by means of hundreds of parallel-connected bonding wires 22 or by means of a flat ribbon having a thickness of 15 to 50 µm with a width of several millimeters.

The individual bonding wire has a diameter of between 15 and 50 µm and essentially comprises gold. The operating temperature of this radiofrequency power semiconductor module as is shown in FIG. 1 is approximately 200° C. The resulting power loss is effectively dissipated to the surroundings by means of the metal base 20 and the metal plate 21. The heat dissipation can be intensified by housing ribs that can be incorporated into the baseplate 21 or can be placed onto the baseplate 21.

The 3rd module of this radiofrequency power semiconductor module 1 is formed by the housing cover 7. Depending on the requirements made of the high-power device, said housing cover may be produced from plastics, ceramic or metal. Metal covers have proved successful as a shielding aid, while ceramic covers have improved dielectric properties compared with a plastic cover. Given a correspondingly high filling of the plastic cover, however, it is also possible to achieve operating temperatures of approximately 200° C. without the plastic cover warping.

FIGS. 2 to 7 illustrate a production method for producing a radiofrequency power semiconductor module 1 on the basis of diagrammatic cross sections through components after individual method steps. Components having functions identical to those in FIG. 1 are identified by the same reference symbols in the following FIGS. 2 to 7 and are not discussed separately.

Figure 2:
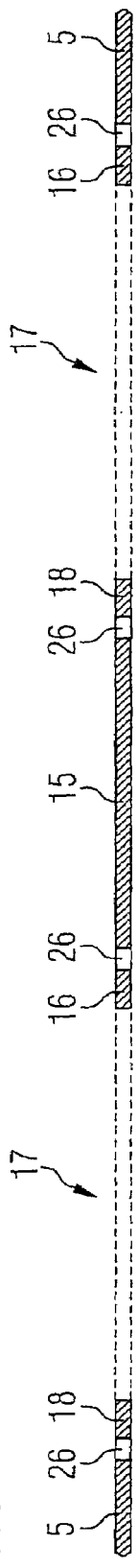

FIG. 2 illustrates a diagrammatic cross section through a flat conductor frame 15 with a plurality of device positions 17. This flat conductor frame 15 is of simple construction and in this respect can be produced extremely cost-effectively. It essentially comprises a metal strip into which individual structures have been stamped which, on the one hand, constitute flat conductors 5 and, on the other hand, form freestanding flat conductor ends 16, the top side of which is in part coated with a bondable coating. The flat conductor ends 16 have passage openings 26. Whereas only two device positions 17 are illustrated diagrammatically in FIG. 2, a flat conductor strip of this type may have as many device positions as desired.

Figure 3:
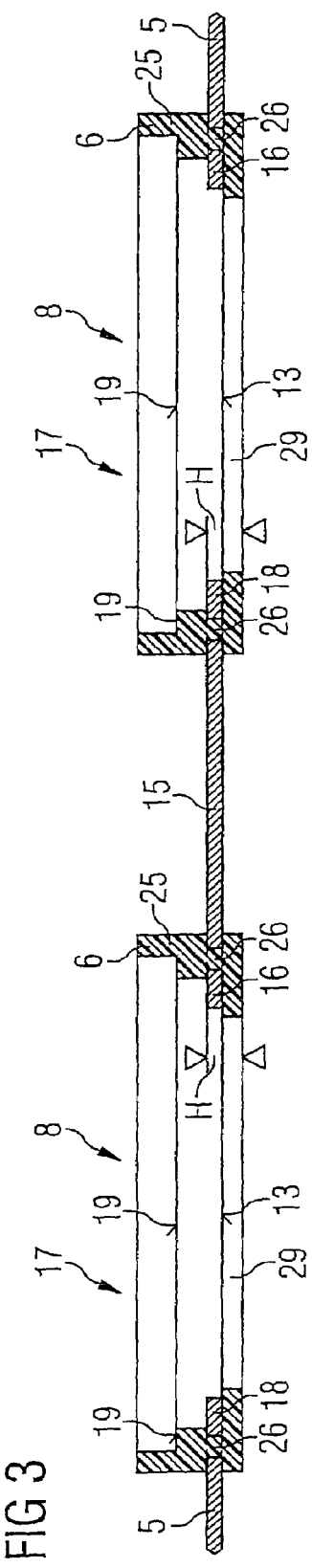

FIG. 3 illustrates a diagrammatic cross section through a flat conductor frame 15 with a molded housing frame 6 in a plurality of device positions 17. Said housing frame 6 is upwardly and downwardly open. The housing frame 6 extends in stepped fashion from bottom to top in this embodiment. In this case, the lower opening has a lower attachment 13, into which the 2nd module 9 can be fitted. The inner flat conductor ends 16 of the flat conductors 5 are arranged on the lower attachment 13, said flat conductor ends 16 having openings 26 which are now completely filled by plastic housing composition, so that the flat conductors 5 are anchored in a positively locking manner in the plastic housing composition 25. At the same time, a portion of the inner flat conductor ends 16 is kept free of housing composition, so that bonding fingers 18 can be formed.

Figure 4:
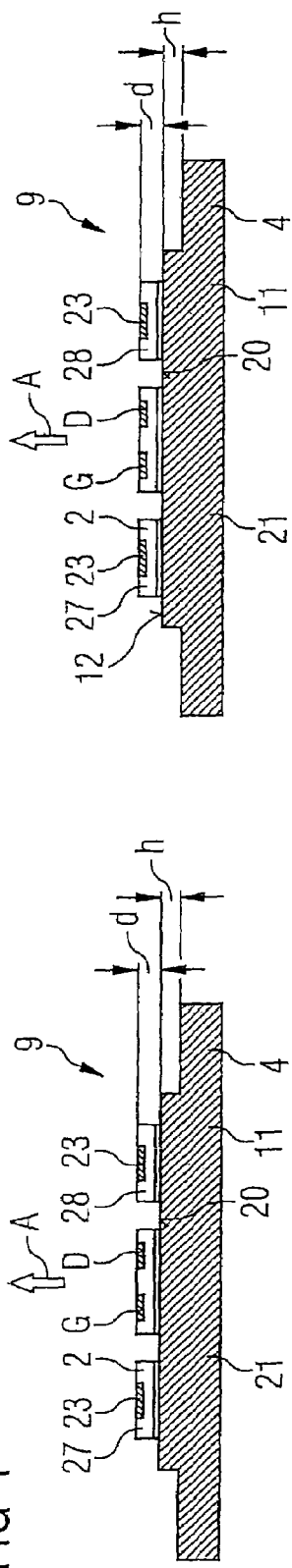

FIG. 4 illustrates a diagrammatic cross section through a 2nd module 9 of the radiofrequency power semiconductor module with applied radiofrequency semiconductor components 2 on a chip island 4 made of metal. Said chip island is in one piece and comprises a metallic baseplate 21 and an emplaced metal base having a height h. Together with the thickness d of the radiofrequency semiconductor component 2, the upper edge of the 2nd module 9 reaches the height level H of the top side of the inner flat conductor ends or the bonding fingers 18, which is illustrated in FIG. 3. Such an adaptation of base height h and chip thickness d to the height level H of the bonding fingers facilitates the bonding of the bonding wires between the bonding fingers 18 of the 1st module 8 and the electrodes 23 of the radiofrequency semiconductor component 2 of the 2nd module 9. For this purpose, the 2nd module 9 is introduced into the bottom opening 29 of the housing frame 6 in arrow direction A and connected to the lower attachment 13 of the housing frame by means of an adhesive layer.

Figure 5:
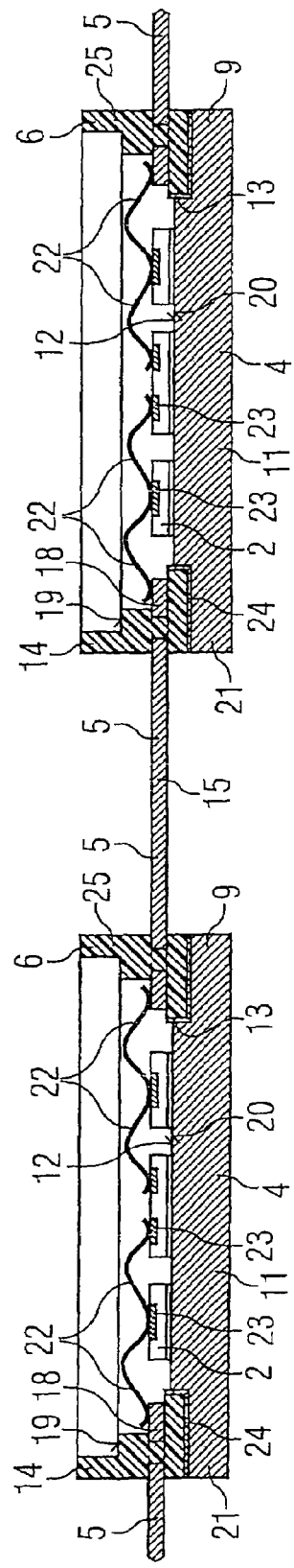

FIG. 5 illustrates a diagrammatic cross section through a radiofrequency power semiconductor module 1 after bonding and prior to covering the cavity housing 3 with a housing cover. The bonding wires 22 that can be seen in the cross section are laid from the bonding fingers 18 to the electrodes 23 of the radiofrequency semiconductor component, on the one hand, and are also wired between the electrodes of the radiofrequency semiconductor component, on the other hand. Since the bonding wires have an extremely small diameter, 500 bonding wires having a diameter of 38 μm are bonded in parallel onto a common electrode of a radiofrequency semiconductor component in this embodiment. A flat conductor comprising the bundle of parallel bonding wires thus arises, in principle.

The bonding, as illustrated in FIG. 5, may still be effected while the individual electronic devices are connected to one another by means of a strip of a flat conductor frame 15, thus resulting in an efficient fabrication. Both the flat conductor frame 15 and the chip island 4 are components that are structured in an uncomplicated manner and can thus be fabricated inexpensively, thereby drastically reducing the overall price for the radiofrequency power semiconductor module compared with devices based on multilayer, three-dimensional flat conductor frame constructions.

FIG. 6 illustrates a diagrammatic cross section through the 3rd module 10 of the radiofrequency power semiconductor module 1. The 3rd module 10 also essentially comprises a relatively simple component. This component, as housing cover 7, is adapted in its external dimensions to the upper attachment 19 of the housing frame 6 and can be placed onto the housing frame 6 in arrow direction B.

FIG. 7 illustrates a diagrammatic cross section through a plurality of radiofrequency power semiconductor modules 1 on a flat conductor frame 15 prior to separation of the flat conductor frame 15 for the production of individual electronic devices 1. For this purpose, the flat conductor frame 15 can be separated in the direction of the dash-dotted line 30, so that the flat conductor frame 15 is split into individual external flat conductors and thus into individual fully functional radiofrequency power semiconductor modules 1.

The invention claimed is:

1. A radiofrequency power semiconductor module comprising:
   a cavity housing;
   one or more radiofrequency semiconductor components;
   a chip island on which the radiofrequency semiconductor components are arranged, and having flat conductors anchored in an upwardly and downwardly open housing frame, and having a housing cover,
   the flat conductors having inner ends with opposing upper and lower sides, wherein the lower sides of the inner ends are completely embedded in the housing frame and a portion of the upper sides of the inner ends is free of the housing frame,
   the radiofrequency power semiconductor module having three prefabricated modules, a first module including the upwardly and downwardly open housing frame with horizontally arranged flat conductors, a second module including the chip island with the radiofrequency semiconductor components as a heat sink and forming the bottom of the cavity housing, and a third module having the housing cover.

2. The radiofrequency power semiconductor module of claim 1, wherein the first module includes a plastic housing frame.

3. The radiofrequency power semiconductor module of claim 1, wherein the first module includes a ceramic housing frame.

4. The radiofrequency power semiconductor module of claim 1, wherein the housing frame is one of a plurality of housing frames arranged on a flat conductor frame.

5. The radiofrequency power semiconductor module of claim 4, wherein the portion of the upper sides of the inner flat conductor ends that are free of housing frame material have refined surfaces as bonding fingers.

6. The radiofrequency power semiconductor module of claim 1, wherein the housing frame widens in a stepped fashion from bottom to top.

7. The radiofrequency power semiconductor module of claim 1, wherein the housing frame has a lower attachment, with which the second module can be brought into engagement.

8. The radiofrequency power semiconductor module of claim 7, wherein the inner flat conductor ends are arranged on the first attachment of the housing frame.

9. The radiofrequency power semiconductor module claim 1, wherein the housing frame has an upper attachment, with which the third module can be brought into engagement.

10. The radiofrequency power semiconductor module of claim 1, wherein the second component has a metal base, which projects from a metallic baseplate and can be brought into engagement with a lower attachment of the housing frame.

11. The radiofrequency power semiconductor module of claim 1, wherein the chip island includes a stepped portion that has a height, which, together with the thickness of the radiofrequency semiconductor components, approximately has the height level of the inner flat conductor ends and a lower attachment of the housing frame, such that the upper sides of the inner ends and an upper side of the radiofreguency semiconductor components lie on a common plane.

12. The radiofrequency power semiconductor module of claim 1, wherein the radiofrequency semiconductor components include at least one radiofrequency power semiconductor component.

13. The radiofrequency power semiconductor module of claim 1, wherein the radiofrequency semiconductor components include at least one radiofrequency IC.

14. The radiofrequency power semiconductor module of claim 1, wherein the flat conductors have passage openings adjacent the inner ends, and wherein the housing frame extends through the passage openings.

15. A radiofrequency power semiconductor module comprising:
   a cavity housing;
   one or more radiofrequency semiconductor components having electrodes;
   a chip island on which the radiofrequency semiconductor components are arranged, and having flat conductors anchored in an upwardly and downwardly open housing frame, and having a housing cover,
   the radiofrequency power semiconductor module having three prefabricated modules, a first module including the upwardly and downwardly open housing frame with horizontally arranged flat conductors, a second module including the chip island with the radiofrequency semiconductor components as a heat sink and forming the bottom of the cavity housing, and a third module having the housing cover;
   the flat conductors having inner ends with opposing upper and lower sides, wherein the lower sides of the inner ends are completely embedded in the housing frame and a portion of the upper sides of the inner ends is free of the housing frame, and wherein hundreds of bonding wires are bonded, in parallel, from the inner flat conductor ends to the electrodes of the radiofrequency semiconductor components.

16. The radiofrequency power semiconductor module of claim 15, wherein at least one flat ribbon having a thickness of 15 to 50 µm in a width of a plurality of millimeters is bonded from the inner flat conductors to the electrodes of the radiofrequency semiconductor components.

17. The radiofrequency power semiconductor module of claim 15, wherein the three modules of the radiofrequency power semiconductor module are connected to one another by means of adhesive layers or adhesive films.

18. The radiofrequency power semiconductor module of claim 15, wherein the flat conductors have passage openings adjacent the inner ends, and wherein the housing frame extends through the passage openings.

19. A method for producing a radiofrequency power semiconductor module, comprising:
  producing a first module having a downwardly and upwardly open housing frame with embedded inner flat conductor ends, flat conductors projecting from the housing frame;
  producing a second module having a metal base on a metal plate, at least one radiofrequency semiconductor component being arranged on the metal base and the metal base being adaptable to the downwardly open housing frame;
  producing a 3rd module having a housing cover that can be fitted into the upwardly open housing frame;
  carrying out of functional and quality tests of the three individual modules;
  assembling the first and second modules by adhesively bonding the metal base of the second module onto the downwardly open housing frame of the first module after a successful functional and quality test;
  connecting the inner flat conductor ends of the first module to electrodes of the radiofrequency semiconductor components of the second module;
  covering of the upwardly open housing frame with the third module.

20. The method as claimed in claim 19, wherein producing a first module comprises producing a flat conductor frame with a multiplicity of device positions, flat conductors with free-standing flat conductor ends being arranged in one plane in each of the device positions and a downwardly and upwardly open housing frame being fitted in each of the device positions, the inner flat conductor ends being embedded in the housing frames, while the flat conductors project from the housing frame.

21. The method as claimed in claim 19, comprising refining the free-standing flat conductor ends with a bondable coating.

22. The method of claim 19, comprising molding the housing frame by means of injection-molding of a plastic housing composition into an injection mold adapted to the flat conductor frame with the free-standing inner flat conductor ends being embedded into the plastic housing composition in each device position.

23. The method of claim 19, molding the housing frame by means of compression molding of a ceramic green body with the free-standing inner flat conductor ends being embedded into the green body in each device position, the green body subsequently being sintered to form a ceramic housing frame.

24. The method of claim 19, comprising:
  checking and testing each housing frame in each of the device positions; and marking unsuitable housing frames on the flat conductor frame.

25. The method of claim 19, wherein producing the second module comprises, firstly producing metal plates with bases adapted to the downwardly open housing frame, and at least one radiofrequency semiconductor component is arranged on each of the bases and its function and connection to the base are tested; and separating unsuitable second modules by sorting.

26. The method of claim 19, wherein the connection of the inner flat conductor ends of the first module to electrodes of the radiofrequency semiconductor components of the second module is effected by multiple parallel bonding of hundreds of bonding wires between one of the inner flat conductor ends and one of the electrodes of the radiofrequency semiconductor component.

27. The method of claim 19, comprising applying a nickel, gold, silver or an alloy thereof on the inner flat conductor ends as a bondable coating.

28. The method of claim 19, comprising laminating the first module with adhesive films in preparation for the connection to the second and/or third module.

* * * * *